United States Patent
Reiherzer et al.

(10) Patent No.: US 8,878,204 B2
(45) Date of Patent: Nov. 4, 2014

(54) SUBMOUNT BASED LIGHT EMITTER COMPONENTS AND METHODS

(71) Applicant: Cree, Inc., Durham, NC (US)

(72) Inventors: Jesse Colin Reiherzer, Wake Forest, NC (US); Christopher P. Hussell, Cary, NC (US); Erin Welch, Chapel Hill, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/829,962

(22) Filed: Mar. 14, 2013

(65) Prior Publication Data

US 2013/0292708 A1    Nov. 7, 2013

Related U.S. Application Data

(60) Provisional application No. 61/643,007, filed on May 4, 2012.

(51) Int. Cl.
| | | |
|---|---|---|
| *H01L 33/48* | (2010.01) | |
| *H01L 25/075* | (2006.01) | |
| *H01L 33/60* | (2010.01) | |
| *F21Y 111/00* | (2006.01) | |
| *H01L 33/62* | (2010.01) | |

(52) U.S. Cl.
CPC ........... *H01L 33/486* (2013.01); *H01L 25/0753* (2013.01); *H01L 2224/48091* (2013.01); *H01L 33/60* (2013.01); *F21Y 2111/001* (2013.01); *H01L 33/62* (2013.01)

USPC ............... 257/88; 257/87; 257/91; 438/27; 438/28

(58) Field of Classification Search
USPC ............... 257/88, 87, 91, 99, 179, E33.002; 438/27, 20, 28; 359/152
See application file for complete search history.

(56) References Cited

U.S. PATENT DOCUMENTS

| | | | |
|---|---|---|---|
| 4,946,547 | A | 8/1990 | Palmour |
| 5,200,022 | A | 4/1993 | Kong |
| RE34,861 | E | 2/1995 | Davis |
| 6,061,160 | A * | 5/2000 | Maruyama ............ 398/201 |
| 7,213,940 | B1 | 5/2007 | Van De Ven |
| 7,791,061 | B2 | 9/2010 | Edmond |
| 8,058,088 | B2 | 11/2011 | Cannon |
| 2008/0173884 | A1 | 7/2008 | Chitnis |
| 2008/0179611 | A1 | 7/2008 | Chitnis |
| 2008/0258130 | A1 | 10/2008 | Bergmann |
| 2010/0155763 | A1 | 6/2010 | Donofrio |

* cited by examiner

*Primary Examiner* — Roy Potter
(74) *Attorney, Agent, or Firm* — Jenkins, Wilson, Taylor & Hunt, P.A.

(57) ABSTRACT

Submount based light emitter components and methods are provided herein. In one aspect, a submount based light emitter component can include a primary submount, a secondary submount, and at least one light emitter chip. The at least one light emitter chip can be disposed over the primary submount and electrically connected to the secondary submount.

52 Claims, 6 Drawing Sheets

SUBMOUNT BASED LIGHT EMITTER COMPONENTS AND METHODS

CROSS REFERENCE TO RELATED APPLICATION

This application relates and claims priority to U.S. Provisional Patent Application Ser. No. 61/643,007, filed May 4, 2012, the entire disclosure of which is incorporated herein by reference.

TECHNICAL FIELD

The subject matter disclosed herein relates generally to components and methods for use with light emitters, such as light emitting diode (LED) chips. More particularly, the subject matter disclosed herein relates to submount based light emitter components and methods.

BACKGROUND

Light emitting diodes (LEDs) or LED chips are solid state devices that convert electrical energy into light. LED chips can be utilized in light emitter components or packages for providing different colors and patterns of light useful in various lighting and optoelectronic applications. Light emitter components and methods can be used in various LED light bulb and light fixture applications, and are developing as replacements for incandescent, fluorescent, and metal halide high-intensity discharge (HID) lighting applications.

Conventional light emitter components can utilize one or more LED chips mounted within a component body and surrounded by a reflector cavity. The component body and integrally formed reflector cavity can be molded from the same material, and portions of the body are typically molded about electrical contacts or leads. Individually molding component bodies can be both expensive and time-consuming. Moreover, changing features related to the reflector cavity require that new molds and/or presses be designed and implemented.

Thus, despite the availability of various light emitter components in the marketplace, a need remains for components and methods which can be produced quickly and efficiently, and which can use a reflective ceramic submount thereby obviating the need for a reflector cavity. In one aspect, submount based components can allow for customized components readily adaptable to different sizes, shapes, and/or for use with secondary submounts such as printed circuit boards (PCBs), external circuitry, heat sinks, FR4 material, and/or flexible circuit materials.

SUMMARY

In accordance with this disclosure, substrate based light emitter components and methods having improved manufacturability and performance are provided and described herein. Components and methods described herein can advantageously exhibit improved processing times, ease of manufacture, and/or lower processing costs. Components described herein can be well suited for a variety of applications such as personal, industrial, and commercial lighting applications including, for example, light bulbs and light fixture products and/or applications. It is, therefore, an object of the present disclosure to provide light emitter components and methods that are submount based and suitable for electrical connection to and/or for use with one or more secondary submounts.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
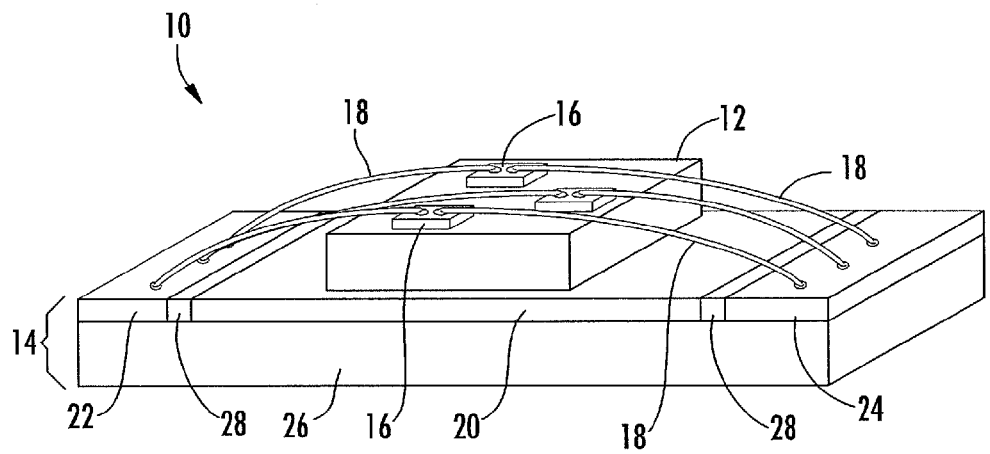
FIG. 1 is a perspective view illustrating a light emitter component according to the disclosure herein.

The subject matter disclosed herein is directed to submount based surface mount design (SMD) light emitter components and methods, such as submount based light emitting diode (LED) components and methods. Components and methods provided herein can exhibit improved manufacturability and can provide customized component bodies, including reflection cavities disposed about LED chips without incurring the expense associated with custom fabricated ceramic or molded packages or components. In some aspects, first and second substrates or submounts disclosed herein (e.g., primary and secondary submounts) can comprise discrete bodies or portions of material (e.g., not packages) which can be manufactured at a low cost, and which do not contain or include leadframe based packages and/or embedded leadframe components. In some aspects, the secondary submount can include a discrete leadframe, which is not embedded in a package body.

Notably, individual submounts can be singulated from a large panel of material, for example, a large ceramic substrate, and can allow a multitude of different components to be formed thereon. Components described herein can comprise non-metallic submount material(s) that is/are substantially transparent and substantially non-absorbing of light emitted by one or more LED chips. Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

In some aspects, submount based components described herein can include a primary submount, which can be ceramic based, and which can support one or more light emitters. The primary submount can be disposed over a secondary submount. Secondary submount can also, optionally include a ceramic based submount, over which one or more metallized layers can be provided. Metallized layers can be printed, deposited, coated, plated, or otherwise applied using any suitable technique. The primary submount can be highly reflective and inexpensive to fabricate, as it can, but does not have to include metal layers or vias. The primary submount can attach to the secondary submount using epoxy, glue, silicone, solder, eutectic bonding, flux, or any other suitable attachment method.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the component in addition to the orientation depicted in the figures. For example, if the component in the figures is turned over, structure or portion described as "above" other structures or portions would now be oriented "below" the other structures or portions. Likewise, if components in the figures are rotated along an axis, structure or portion described as "above", other structures or portions would be oriented "next to" or "left of the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

Light emitter components according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946, 547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wirebonded. A vertical device (with or without the growth substrate) can have a first terminal (e.g., anode or cathode) solder bonded to a carrier substrate, mounting pad, or PCB and a second terminal (e.g., the opposing anode or cathode) wirebonded to the carrier substrate, electrical element, or PCB. Examples of vertical and horizontal LED chip structures are discussed by way of example in U.S. Publication No. 2008/0258130 to Bergmann et al. and in U.S. Pat.

No. 7,791,061 to Edmond et al. which issued on Sep. 7, 2010, the disclosures of which are hereby incorporated by reference herein in their entireties.

One or more LED chips can be at least partially coated with one or more phosphors. The phosphors can absorb a portion of light from the LED chip and emit a different wavelength of light such that the light emitter component emits a combination of light from each of the LED chip and the phosphor. In one embodiment, the light emitter component emits what is perceived as white light resulting from a combination of light emission from the LED chip and the phosphor. In one embodiment according to the present subject matter, white emitting components can consist of an LED chip that emits light in the blue wavelength spectrum and a phosphor that absorbs some of the blue light and re-emits light in the yellow wavelength spectrum. The components can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. In other aspects, incorporating phosphor(s) within a silicone encapsulant material and dispensing the mixture of phosphor and silicone can be applied over LED chips. It is understood that light emitter components and methods according to the present subject matter can also have multiple LED chips of different colors, one or more of which can be white emitting.

FIGS. 1 through 9B illustrate embodiments of submount based light emitter components and methods according to the present subject matter as disclosed and described herein. FIG. 1 is a submount based light emitter component, generally designated 10. Notably, emitter component 10 can comprise a discrete primary submount 12 and a discrete secondary submount 14. One or more light emitters, such as an LED chip 16, can be disposed over a portion of the primary submount 12. Primary and secondary submounts 12 and 14, respectively, can be any suitable size, shape, thickness, and/or material. Thus, primary and secondary submounts 12 and 14 can advantageously allow for customized packages and/or components for LED chips by adapting to any desired size, shape, or electrical configuration desired. Emitter components described herein can also advantageously bend or flex (see e.g., FIG. 8) to produce various different and/or multi-faceted components for use in various lighting products, fixtures, and applications.

Primary submount 12 can comprise a non-metallic and/or ceramic based material which can be individually formed (e.g., via pressing) and/or be singulated from a large substrate or panel of submounts (not shown). In one aspect, primary submount 12 can comprise a transparent ceramic material for maximizing light extraction and reflectance. For example, primary submount 12 can comprise aluminum oxide (e.g., alumina or $Al_2O_3$), aluminum nitride (AlN), zirconium dioxide (e.g., zirconia or $ZrO_2$), beryllium oxide (BeO), titanium dioxide ($TiO_2$), yttrium-aluminum-garnet (e.g., YAG or $Y_3Al_5O_{12}$), and/or any other generally known ceramic based material or combinations thereof. Primary submount 12 can comprise any thickness, for example and without limitation, equal to or greater than approximately 0.05 millimeters, such as approximately 0.1 mm or more, approximately 0.5 mm or more, or approximately 1 mm or more. Generally, it can be desirable to provide an optically thick primary substrate or submount 12 that is highly reflective to visible light (e.g., greater than about 90%), and which can provide conduction of heat as well as mechanical support. Thus, in some aspects, primary submount 12 can preferably comprise a ceramic based body of material such as $Al_2O_3$ and its derivatives and/or containing $Al_2O_3$ and its derivatives.

In one aspect, primary submount 12 can comprise a body of ceramic material that can be cast from low temperature co-fired ceramic (LTCC) materials or high temperature co-fired ceramic (HTCC) materials and related processes. In one embodiment, primary submount 12 can be individually cast from a thin green ceramic tape and subsequently fired. Primary submount 12 can also be cast and subsequently fired and singulated from a panel of submounts formed from a thin green ceramic tape. Where used, the ceramic tape can comprise any ceramic filler material known in the art, for example, primary submount 12 can comprise a glass ceramic, such as $Al_2O_3$ or aluminum nitride (AlN) having 0.3 to 0.5 weight percent of glass frits. The glass frits can be used as a binder and/or sintering inhibitor within the ceramic tape when the tape is fired.

In further embodiments, primary submount 12 can comprise a green tape formed by casting a thick layer of a slurry dispersion of glass frits, ceramic filler, one or more additional binders, and a volatile solvent. In some aspects, an amount of $Al_2O_3$ contained within HTCC ceramics can be approximately equal to 96% or more for a higher thermal conductivity. The cast layer can be heated at low temperatures to remove the volatile solvent. The green ceramic tape used for primary submount 12 can advantageously comprise any thickness desired, thus contributing to a thinner size when desired. Primary submount 12 can further comprise a ceramic material having any of a variety of optional scattering particles contained therein. Examples of suitable scattering particles can for example include particles of $Al_2O_3$, $TiO_2$, $BaSO_4$, and/or AlN. Primary submount 12 can be produced by thin- or thick-film processing techniques available at and including products available from CoorsTek, headquartered in Golden, Colo. Such substrates or submounts 12 can optionally be fired along with other materials (e.g., $ZrO_2$) to further improve optical and mechanical properties.

Primary submount 12 can comprise any length and/or width which can be customized to the lighting application and/or for reflection. For example, primary submounts 12 that are thicker and/or have a larger surface area can be used for increasing reflection from component. In other aspects, smaller and thinner primary submounts 12 can be used in smaller spaces. In one aspect, primary submount 12 can comprise a length and/or a width that is equal to or greater than approximately 0.5 mm, such as approximately 1 mm or more. Primary submount 12 can comprise a length that is equal or unequal to a width.

Still referring to FIG. 1, primary submount 12 can be disposed over a secondary submount 14. Any generally known method(s) and/or material(s) for attaching primary submount 12 to secondary submount 14 is/are contemplated herein. For example, primary submount 12 can be attached to secondary submount via an epoxy, solder, solder paste, tape, adhesive, glue, silicone, flux material, AuSn solder paste, eutectic material, any combination thereof and/or other generally known related methods and materials. In one aspect, one or more portions of primary and secondary submounts 12 and 14, respectively, can be joined or attached via application of an adhesive, application of heat and/or pressure, soldering, welding, gluing, threading (e.g., screwing), locking, clamping, crimping, physically retaining a portion of primary submount 12 in a portion of secondary submount 14 (see, e.g., FIG. 4) or vice versa, combinations thereof, and/or any other suitable process. In one aspect, primary submount can comprise a metalized backside adapted to physically and/or electrically attach to secondary submount 14 via solder or other attachment method. Primary submount 12 can also optionally comprise one or more electrically conductive thru-holes or vias for passing electrical signal from secondary submount 14 into primary submount and into LED chip 16, where desired. In further aspects, primary submount 12 can be electrically insulating and/or non-conductive (e.g., does not contain electrically conductive materials and/or metals) and, therefore, may not be suitable for passing or receiving any amount of electrical current.

Secondary submount 14 can comprise any suitable material, and can comprise either the same material as primary submount 12 or a different material than primary submount 12. In some aspects, emitter component 10 can comprise primary submount 12 disposed over, on, and/or supported by a secondary submount 14 comprising a ceramic mount. In some aspects, at least a portion of secondary submount 14 can be coated with an electrically conductive material for receiving and passing electrical current into the component and LED chip 16. Secondary submount 14 can comprise one or more portions of a metallic material, a non-metallic material, a ceramic material, a dielectric material, a composite material, a flame resistant FR-4 (or FR4) material, a laminated structure or material, a PCB, a metal core printed circuit board (MCPCB), a leadframe, a retaining or retention member (e.g., FIG. 4), a flex circuit, and/or portions or combinations thereof. Secondary submount 14 can comprise any suitable size and/or thickness. In one aspect, secondary submount 14 can be the same size (e.g., length and/or width, or footprint) and/or thickness as primary submount 12. In further aspects, secondary submount can be greater in length and/or width than primary submount 12.

Secondary submount 14 can be thicker or thinner than primary submount. In one aspect, secondary submount can be a thickness that is equal to or greater than approximately 0.05 millimeters, such as approximately 0.1 mm or more, approximately 0.5 mm or more, approximately 1 mm or more, approximately 2 mm or more, approximately 3 mm or more, approximately 5 mm or more, or approximately 10 mm or more. Secondary submount 14 can comprise a length and/or a width that is equal to or greater than approximately 0.5 mm, such as approximately 1 mm or more, approximately 2 mm or more, approximately 3 mm or more, approximately 5 mm or more, approximately 6 mm or more, approximately 7 mm or more, approximately 8 mm or more, or approximately 10 mm or more. In some aspects, secondary submount can be disposed on a reel and can be much longer than 10 mm. In some aspects, secondary submount can be configured to accommodate more than one, or multiple primary submounts and LED chips disposed thereon. Secondary submount 14 can comprise a length that is equal or unequal to a width.

Notably, one or more LED chips 16 can be physically disposed over or connected to primary submount 12 but electrically connected to secondary submount 14. Primary and secondary submounts 12 and 14, respectively, can advantageously be customized in size, shape, thickness and/or choice of material for providing customized packages or components for LED lighting products or fixtures. For example, primary and/or secondary submounts 12 and/or 14 can be a customized length and/or width to produce a beam pattern having a desired shape or width or to fit into a custom sized space.

Optional coating(s) and/or layer(s) of material (not shown) can optionally be disposed over portions of primary submount 12 and/or portions of secondary submount 14 for increasing adhesion of one or more LED chips 16 to portions primary submount 12 and/or for improving the wirebondability of portions secondary submount 14. In one aspect, an optional layer of material (not shown) can be applied to primary submount 12 prior to die attaching or bonding LED chip 16. Any suitable material for increasing the bonding and/or amount of heat conducted between LED chip 16 and primary submount 12 can be applied. For example, a layer of silicone, epoxy, or any other polymer known to those having skill in the art can optionally be applied over portions of primary submount 12. Alternatively, a ceramic or metal material can be applied over portions of primary submount 12. One or more reflective particles, such as $Al_2O_3$, $TiO_2$, $ZrO_2$, combinations thereof, or any other reflective particle known to those having skill in the art can be applied to portions of primary and/or secondary submounts 12 and/or 14, respectively. An adhesion promoting layer (not shown) can also be applied to portions of secondary submount 14 such as an electroless nickel and immersion gold material (i.e., ENIG) for improving the bonding or adhesion between wirebonds 18 and portions of secondary submount 14. More than one layer of material (not shown) applied to portions of primary and/or secondary submounts 12 and/or 14, respectively, is also contemplated herein.

As noted above, at least one LED chip 16 can be disposed over primary submount 12. In one aspect, more than two LED chips 16 can be provided over primary submount 12. As FIG. 1 illustrates, at least three LED chips 16 can be attached to primary submount 12. Each LED chip 16 can optionally be directly attached to primary submount 12 via an index matched epoxy or epoxy material (not shown), a silicone material, a solder material, a eutectic material, a flux material, an adhesive, combinations thereof, and/or any other suitable material adapted to physically attach LED chip 16 to a non-metallic submount material. LED chips 16 can be electrically connected to secondary submount 14 via one or more wirebonds 18. LED chips 16 can comprise any size, shape, color, build, and/or structure. For example, as illustrated, each LED chip 16 can comprise a substantially rectangular shape and a horizontal structure where both electrical contacts (e.g., bond pads) are disposed on an upper surface of the LED chip, such that the upper surface of the chip can be wirebonded to secondary submount 14. LED chips 16 having a horizontal structure with both contacts on the bottom and/or vertically structured LED chips 16 are also contemplated herein.

LED chips 16 can comprise a carrier substrate or a growth substrate. Non-rectangular shaped chips are contemplated herein, for example, square or asymmetrically shaped chips can be used. LED chips 16 can comprise straight-cut chips (e.g., substantially vertical lateral sides) and/or bevel cut chips (e.g., sloped or inclined lateral sides). LED chip 16 can comprise any size and/or shape. LED chip 16 can be substantially square, rectangular, regular, irregular, or asymmetrical in shape. In one aspect, LED chip 16 can for example comprise a footprint where at least one side measures approximately 3000 µm or less, such as approximately 2500 µm or less; approximately 2000 µm or less; approximately 1000 µm or less; approximately 900 µm or less; approximately 700 µm or less; approximately 600 µm or less; approximately 500 µm or less; approximately 400 µm or less; approximately 300 µm or less; approximately 200 µm or less; and/or combinations thereof where multiple LED chips 16 are used.

Light emitter component 10 can further comprise electrically conductive portions of material adapted to pass electrical current into the one or more LED chips 16. Notably, the electrically conductive portions can be integrally formed with and/or disposed on a portion of secondary submount 14. For example, secondary submount 14 can comprise a mounting portion or area 20, a first electrically conductive portion or electrical contact 22 and a second electrically conductive portion or second electrical contact 24. Mounting area 20 can be disposed proximate to and/or adjacent first and second electrical contacts 22 and 24, respectively, and can optionally be disposed between first and second contacts 22 and 24, respectively. Mounting area 20 can be adapted to attach to a portion of primary submount 12. First and second electrical contacts 22 and 24 can also be referred to as "leads" or "traces". First and second electrical contacts 22 and 24 can comprise areas or portions of secondary submount 14 which can be electrically conductive. In one aspect, mounting area 20 and first and second electrical contacts 22 and 24, respectively, can comprise a layer of material that is glued or laminated over a core or base material 26. Base material 26 can comprise a layer of thermally and/or electrically conductive material such as aluminum (Al), copper (Cu), a ceramic material, a dielectric material, and/or combinations thereof.

Notably, secondary submount 14 can be adapted to physically, electrically, and/or thermally connect to an external power source or heat sink (not shown), such that electrical current can pass from the power source or heat sink into a portion of secondary submount 14 and into LED chip 16 via a wirebond 18, thereby illuminating LED chip 16. Electrical current can also flow or pass out of LED chip 16 and into a portion of secondary submount 14 (e.g., first or second electrical contact 22 or 24) via wirebond 18, and then out of secondary submount 14. In one aspect, secondary submount 14 can comprise a metallized backside and/or vias (not shown) for electrically communicating electrical current from the power source to the LED chip 16. Notably, LED chip 16 can be disposed over a portion of ceramic based primary submount 12 and electrically connected to a portion of secondary submount 14.

Submount based light emitter components as described herein can be customized to various lighting applications by customizing at least the size, shape, thickness, and/or materials of which primary and secondary submounts 12 and 14 are comprised. For example, the sizes and shapes of primary and secondary submounts 12 and 14 can be customized to different sized square, rectangular, circle, oval, asymmetrical, multi-faceted, or even three-dimensional shapes for obtaining light of a desired shape or beam pattern. The materials of primary and secondary submounts 12 and 14 can also be customized to obtain desired power, reflection, or optical and/or thermal performance.

Figure 2:
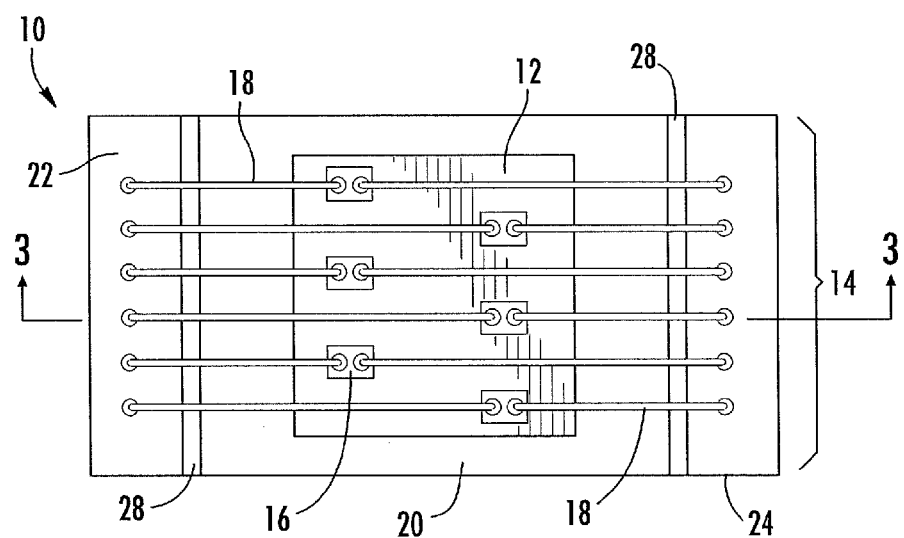
FIG. 2 is a top plan view illustrating a light emitter component according to the disclosure herein.

FIG. 2 is a top view of light emitter component 10, where the component comprises more than three LED chips 16. In this aspect, component 10 can comprise six LED chips 16. However, any number of LED chips 16 can be used, for example, one LED chip 16, two LED chips 16, three LED chips 16, four LED chips 16, five LED chips 16, six LED chips 16, more than six LED chips 16, more than 10 LED chips 16, or more than 20 LED chips 16. A plurality of LED chips 16 can be arranged in an array over primary submount 12. LED chips 16 can electrically connect to first and second electrical contacts 22 and 24 via wirebonds 18. One of first and second electrical contacts 22 and 24, respectively, can comprise an anode and the other a cathode. LED chips 16 can be electrically connected in parallel (e.g., each connected to both electrical contacts, as shown) or LED chips 16 can optionally be electrically connected in series. It is also contemplated that one or more series of LED chips 16 can be electrically connected in parallel. As FIGS. 1 and 2 illustrate, secondary submount 14 can comprise one or more intermediate portions 28. Intermediate portions can be adapted or configured for electrically and/or thermally separating one or more portions of the submount. In one aspect, each intermediate portion 28 can comprise an electrically insulating material such as a dielectric or plastic material, such as a photo-imagable solder mask, for separating electrically conductive portions (e.g., contacts 22 and 24) of secondary submount 14. In other aspects, intermediate portions 28 can simply comprise a gap filled with ambient air which physically separates mounting area 20 from first and second electrical contacts 22 and 24. That is, in some aspects, first and second contacts 22 and 24 can comprise portions of metal that have been coated or applied over base material 26. In some aspects, base material 26 comprises a ceramic based material which has been coated with one or more layers of metal, and the metal can form first and second contacts 22 and 24.

Figure 3A:
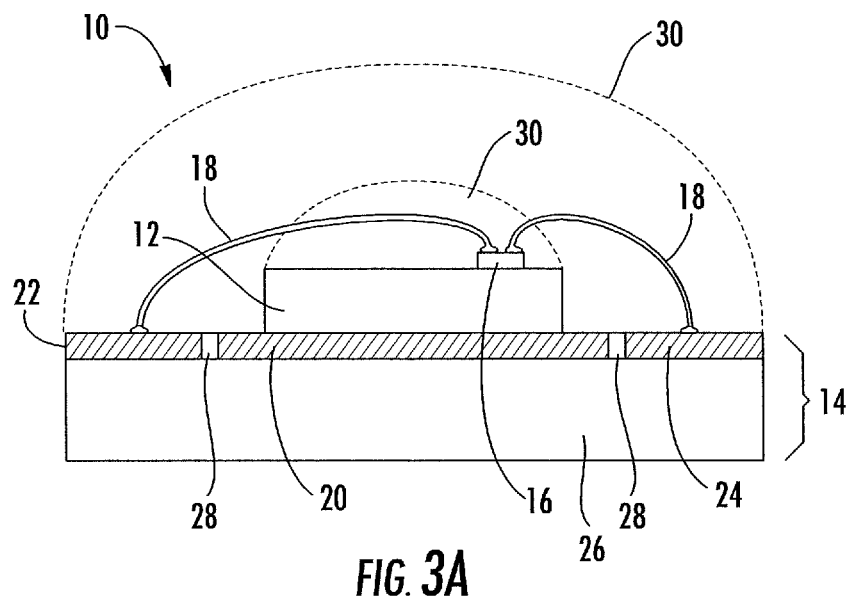
FIGS. 3A and 3B are cross-sectional views illustrating light emitter components according to the disclosure herein.
Figure 3B:
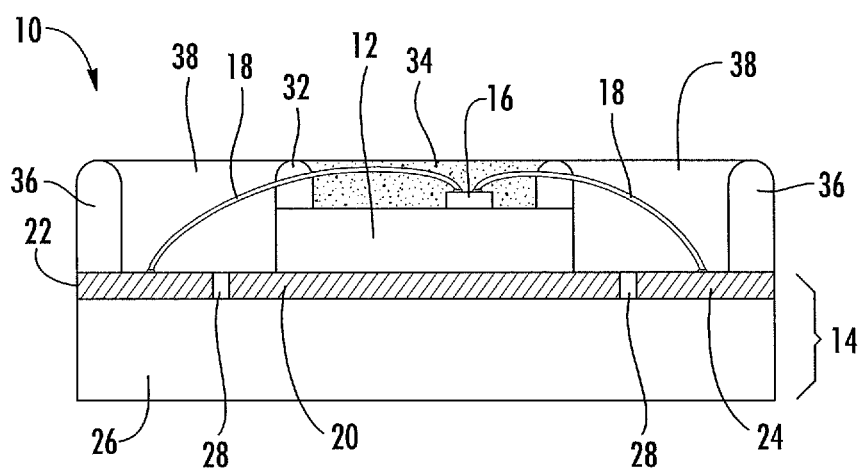

FIGS. 3A and 3B are cross-sectional views of emitter component 10, which can further comprise an optical element such as a lens or encapsulant material adapted to improve optical performance, color, and/or obtain a desired beam pattern or emission from emitter component 10. As FIG. 3A illustrates, an optional optical element 30 can be disposed over LED chip 16 and a portion of primary submount 12, or optionally over portions of secondary submount 14, primary submount 12, and LED chip 16. In one aspect, the optical element 30 can be retained on the surface of primary submount 12 and/or secondary submount 14 via surface tension. In further aspects, a retention wall or dam (e.g., 32, FIG. 3B) can be positioned over secondary submount 14 for retaining at least a portion of optical element. Wirebonds 18 can be fully exposed to the environment (e.g., FIG. 1), partially exposed and partially encapsulated (e.g., FIG. 3A), or fully encapsulated (e.g., FIG. 3B) as desired.

Optical element 30 can comprise a lens and/or a layer of silicone encapsulant material. Optical element 30 is shown in broken lines as it is optional, and characteristics such as shape, size, thickness, and/or placement are optional. In one aspect, optical element 30 can comprise a lens having a substantially hemispherical or dome shaped cross-section. The lens can be positioned such that the apex, or point of greatest height, is disposed over a centerline of primary submount 12. However, a lens that is off-center from a centerline of primary submount 12 is also contemplated herein. The lens can be molded and/or cured using known processes. Optical element 30 can be formed directly and/or indirectly over a top surface of primary submount 12, and can be disposed over at least a portion of one LED chip 16. An array of lenses or optical elements 30 molded and/or positioned over a corresponding array of LED chips 16 is also contemplated herein.

In further aspects, lens element 30 can comprise a portion of encapsulant material having a substantially hemispherical or dome shaped cross-section. The base of optical element 30 can extend towards outermost edges of primary submount 12, such that a lens base can comprise the same shape as the shape of primary submount 12. As FIG. 3A illustrates, placement of optical element 30 is optional and can be customized to provide desired beam patterns and shapes. Optical element 30 can comprise a liquid curable silicone material, an epoxy material, or any encapsulant material such as a methyl or phenyl silicone based encapsulant material. In some aspects, phosphor(s) can be added to optical element 30 to adjust the color point.

As FIG. 3B illustrates, a first retention dam 32 can be positioned over a portion of primary submount 12 to retain an optical member, such as a first layer or portion of encapsulant 34. Retention dam 32 can comprise a cup or wall configured to at least partially retain optical member, such as encapsulant 34. Retention dam 32 can comprise a material that is different than the material(s) of one or both of primary submount 12 and/or secondary submount 14. Encapsulant 34 can further comprise an optical conversion material, as denoted by the speckled appearance, for producing cool and/or warm white light. Optical conversion material can comprise one or more phosphors or lumiphors (e.g., yellow, red, and/or green phosphor) which can be activated by light emitted from the one or more LED chips 16. In further aspects, LED chips 16 can activate a yellow, red, and/or green phosphor disposed in a layer (not shown) directly over a portion of one or more LED chips 16 and/or directly over a portion of emitter component 10 for producing cool and/or warm white output. Retention dam 32 can comprise a dispensed material, such as a dispensed silicone, epoxy, plastic, polyamide (e.g., PPA), or any material that can be optionally cured and optionally tinted white (e.g., via addition of $TiO_2$) for increasing the amount of light reflected and/or emitted from component 10. In further aspects, retention dam 32 can comprise an injection molded plastic member. As FIG. 3B illustrates, first portion of encapsulant 34 can comprise a layer of silicone encapsulant or epoxy having a substantially flat surface. However, concave and/or convex surfaces are also contemplated herein. Retention dam 32 can comprise any suitable height, and can be customized in height for different applications or light output. Retention dam can comprise a height that is approximately equal in height with an upper surface of one or more LED chips 16, a height that is greater than and fully above the upper surface of one or more LED chips 16, and/or a height that is fully below the upper surface of one or more LED chips 16.

Light emitter component 10 can further comprise a second retention dam 36 disposed over a portion of secondary submount 14. Second retention dam 36 can be adapted to retain a second layer or portion of encapsulant 38. Second portion of encapsulant 38 can comprise a layer of silicone based encapsulant with or without an optical conversion material, such as one or more phosphors. In one aspect, second portion of encapsulant 38 can be at least partially or fully optically clear. In other aspects, second portion of encapsulant 38 can be white and highly reflective. Second portion of encapsulant 38 can encapsulate wirebonds 18 for providing physical or mechanical protection (e.g., to prevent breakage) as well as chemical or environmental protection (e.g., to prevent degradation or corrosion). Second retention dam 36 can be the same height as first retention dam 32, or any height taller or shorter than first retention dam 32 is also contemplated herein. In one aspect, second retention dam 36 can comprise a height corresponding to a maximum height of one or more wirebonds 18 above secondary submount 14, such that second portion of encapsulant 38 can adequately cover and encapsulate wirebonds 18.

LED chips 16 described herein can embody solid state emitters used alone and/or in combination with optical conversion material comprising, for example, phosphors or lumiphors to emit light of various colors, color points, or wavelength ranges, such as light that is primarily white, blue, cyan, green, yellow, amber, or red. In one aspect light emitter components described herein can comprise one or more LED chips 16 that are primarily blue, which when illuminated, can activate a yellow phosphor disposed over the one or more chips 16 (e.g., phosphor can be at least partially directly disposed over LED chips 16 and/or on a portion of light emitter component 10 that is disposed over LED chips 16. In alternative embodiments, a primarily red LED chip 16 can be included in emitter components described herein and can be used alone and/or combination with a blue LED chip with yellow phosphor. In one aspect, a red LED chip 16 can also optionally be disposed below a phosphor, encapsulant, lens and/or combinations thereof, such as optical element 30 or 34 with a phosphor layer for mixing to produce warm white output. As noted earlier, component 10 can comprise more than one LED chip 16 such as a plurality and/or array of LED chips 16. Each chip in the plurality or array of LED chips 16 can for example be approximately the same wavelength (e.g., selected from the same targeted wavelength bin). In the alternative, at least a first LED chip 16 of the plurality of chips can comprise a different wavelength than at least a second LED chip of the plurality of chips (e.g., at least a first LED chip 16 could be selected from a different targeted wavelength bin than at least one other LED chip 16).

Figure 4:
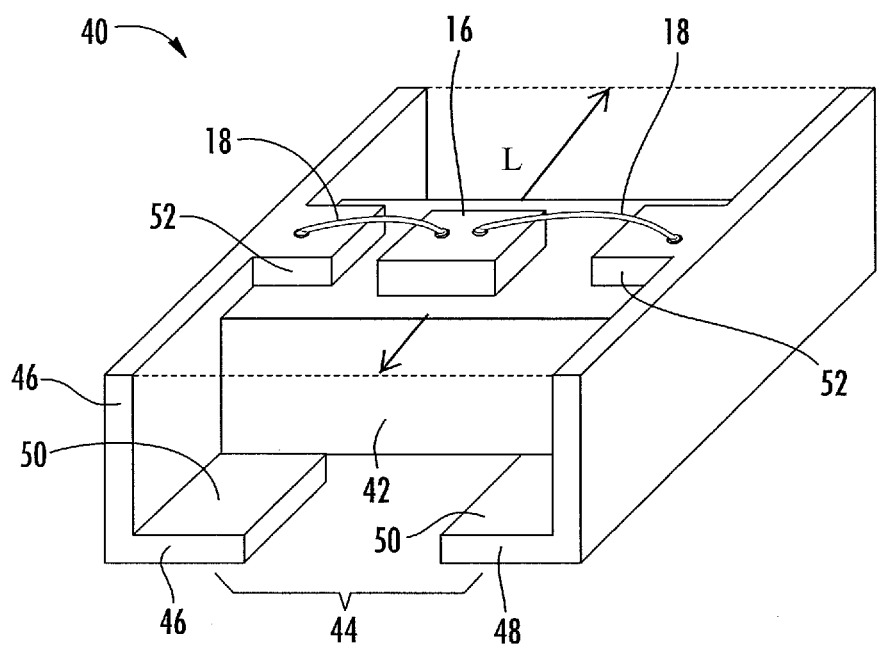
FIGS. 4 through 6 are further embodiments illustrating light emitter components according to the disclosure herein.
Figure 5:
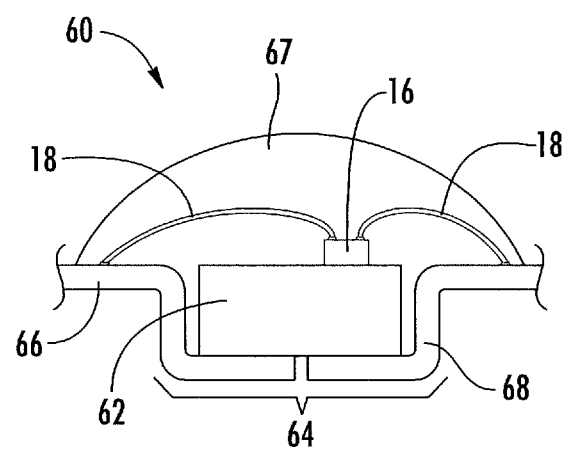
Figure 6:
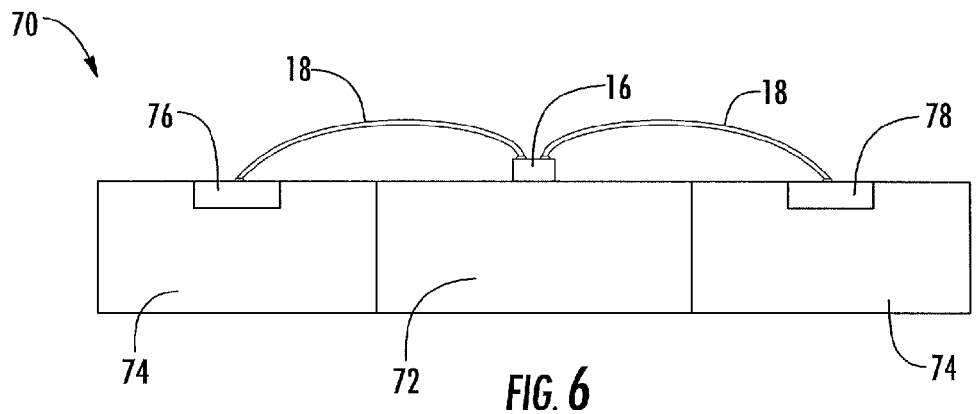

FIGS. 4 to 6 are further embodiments of submount based light emitter components. FIG. 4 illustrates a light emitter component, generally designated 40, in which at least a portion of a primary submount is retained within at least a portion of a secondary submount. For example, light emitter component 40 can comprise a primary submount 42 and a secondary submount, generally designated 44. Primary submount 42 can comprise any and/or all of the features described with respect to primary submount 12. In one aspect, primary submount 42 can be slidable with respect to secondary submount 44 before the primary submount 42 is fixed with respect to secondary submount 44 via an adhesive. In some aspects, primary submount 42 can be smaller in length than secondary submount 44. In other aspects, as the arrows indicate, primary submount 42 can comprise a length L that is substantially the same as and/or substantially equal to a length of secondary submount 44, such that edges of primary submount 42 are substantially flush with edges of secondary submount 44.

Primary submount 42 can comprise a ceramic based material adapted to improve light extraction and reflectance. Primary submount 42 can optionally be transparent and/or highly reflective material. In one aspect, primary submount 42 can comprise $Al_2O_3$, AlN, $ZrO_2$, BeO, $TiO_2$, $Y_3Al_5O_{12}$, and/or any other generally known ceramic based material or combinations thereof. Primary submount 12 can comprise any desired size, shape, thickness, and/or material, and can conform to custom sized or custom designed lighting products, fixtures, or systems.

Secondary submount 44 can comprise a retaining member or body for supporting and physically retaining a portion of primary submount 42. In one aspect, secondary submount 44 can be disposed along or about one or more external surfaces of primary submount such that it covers primary submount 42. In some aspects, secondary submount 44 can be disposed along at least two or more than two lateral sides of primary submount 42. Secondary submount 44 can comprise an electrically conductive metal, such as a metal or metal alloy. In one aspect, secondary submount 44 can comprise a first retention member 46 and a second retention member 48. First retention member 46 can be spaced apart from and oppose second retention member 48. A portion of primary submount 42 can be retained by first and second retention members 46 and 48, respectively, and can optionally be retained between first and second retention members 46 and 48.

First and second retention members 46 and 48 can comprise a lower flange having a surface or shelf portion 50 upon which primary submount 42 can be slidably received. Primary submount 42 can be fixedly secured between shelf portions 50 of first and second retention members 46 and 48, respectively, and one or more respective upper guide portions 52 upon being slidably received between first and second retention members 46 and 48. In one aspect, primary submount 42 can be clamped between and/or secured via frictional engagement with shelf portions 50 and upper guide portions 52 of first and second retention members 46 and 48, respectively. In further aspects, a solder, paste, epoxy, glue, or adhesive material (not shown) can be disposed between portions of primary submount 42 and secondary submount 44 to fixedly secure and retain a portion of primary submount 42 within a portion of secondary submount 44. First and second retention members 46 and 48 can also be integrally connected or formed as opposing sides, for example, of a vessel or retention space. In this aspect, secondary submount 44 can be adapted to slidably receive portions of primary submount 42 between the opposing portions of first and second retention member 46 and 48.

Notably, at least one or more LED chip 16 can be disposed over primary submount 42 and electrically connected to a portion of secondary submount 44. In one aspect, at least one LED chip 16 can be electrically connected to guide portions 52 of first and second retention members 46 and 48 via wirebonds 18. Guide portions 52 of first and second retention members 46 and 48 can comprise first and second electrical contacts or electrical leads. Guide portions 52 of retention members 46 and 48 can comprise an anode/cathode pair configured to pass electrical current into LED chip 16. Emitter component 40 can comprise custom sized and/or custom designed primary and secondary submounts 44 and 44, respectively, which can be produced inexpensively and can be adapted for use in custom sized lighting applications. For example, primary submount 42 can be produced inexpensively by singulating any desired size/shape of submount from a panel of ceramic based material (not shown). Primary submount 42 can be singulated from a large substrate of ceramic based material via cutting, sawing, grinding, etching, breaking, and/or any other method of physically dividing the large substrate into individual submounts. Secondary submount 44 can be produced inexpensively, for example and without limitation, by bending, crimping, molding, or otherwise forming portions of electrically conductive material about primary submount 42, for example, by bending one or more pieces of metal about primary submount 42.

FIG. 5 illustrates a further embodiment of a light emitter component, generally designated 60. Light emitter component 60 can comprise a submount based component. As FIG. 5 illustrates, at least one LED chip 16 can be disposed over and mounted either directly or indirectly to a non-metallic primary submount 62. In one aspect, primary submount 62 can comprise a ceramic based submount, such as previously described primary submount 12. Notably, this technology allows for substantially flat primary submounts 62 to be formed into a multitude of different and/or customized packages or components without having to incur expenses associated with custom fabricated plastic or ceramic packages or components. Light emitter component 60 can comprise a ceramic based light emitter component (e.g., comprising a ceramic based primary submount) for providing improved light scattering and reflection and, therefore, improved efficiency, brightness, and light extraction capabilities. Ceramic based submounts may also be desirable for use in light emitter components described herein for improved thermal management properties. For example, $Al_2O_3$ and AlN materials exhibit relatively low thermal resistance, low moisture sensitivity, superior reliability at high temperature environments, and the superior ability to dissipate heat.

Component 60 can further comprise a secondary submount 64. Secondary submount 64 can comprise an electrically conductive material such as a metal or metal alloy. In one aspect, secondary submount 64 can comprise a discrete leadframe comprising bent leads which form an area for receiving and supporting a portion of primary submount 62. In one aspect, secondary submount 64 can comprise a base material (e.g., Cu or Ag) and one or more layers of material (not shown) including one or more layers of Ag, Cu, Ni, Au, Pd, or combinations thereof. In one aspect, primary submount 62 can be inset with respect to secondary submount 64. In further aspects, primary submount 62 is inset within a portion of secondary submount 64. Notably, at least one LED chip 16 can be disposed over primary submount 12 and electrically connected to secondary submount 64 via wirebonds 18.

Secondary submount 64 can comprise a first electrically conductive portion or electrical contact 66 and a second electrically conductive portion or second electrical contact 68. First and second electrical contacts 66 and 68, respectively, can be spaced apart and can also be referred to as leads. First and second electrical contacts 66 and 68 can comprise an anode/cathode pair configured to pass electrical current into and illuminate LED chip 16. First and second electrical contacts 66 and 68 can bend about a space and/or form a depression or shelf adapted to receive a portion of primary submount 62. Each contact can comprise a lower portion for contacting and supporting primary submount 62. The lower portion of each contact can for example be non-planar with an upper portion to which LED chip 16 can be wirebonded. In one aspect, primary submount 62 can be inset within a portion of secondary submount 64 such that wirebonds 18 terminate along a surface of secondary submount 64 that is co-planar with LED chip 16. In other aspects, LED chip 16 can be non-planer, and either partially disposed above each portion of secondary submount 64 or partially disposed below at least one portion of secondary submount 64.

Light emitter component 60 can further comprise an optional optical element 67 that can comprise, for example and without limitation, a lens or layer of encapsulant. An optical conversion material can optionally be disposed in and/or over a portion of optical element 67. For example, a layer of one or more phosphor or phosphor containing materials can be disposed over a portion or surface of a lens or within a portion of the encapsulant. In other aspects, the optical conversion material can be directly disposed over a portion of LED chip 16.

FIG. 6 illustrates a further embodiment of a light emitter component, generally designated 70. Light emitter component can comprise a primary submount 72 disposed between one or more portions of a secondary submount 74. For example, primary submount 72 can be pushed through secondary submount 74, such that secondary submount comprises a first portion and a second portion. Each portion can comprise an electrically conductive portion. For example, secondary submount 74 can comprise a first electrical contact 76 and a second electrical contact 78 adapted to pass electrical current into at least one LED chip 16 via wirebonds 18. First and second electrical contacts 76 and 78 can comprise one or more metals or metal alloys. Primary submount 72 can comprise a ceramic based submount. Secondary submount 72 can comprise any desired material, including a ceramic based submount, a metallic submount, a polymeric or plastic material, an injection molded material, a composite material, a laminate material, or a dielectric material disposed about first and second electrical contacts 76 and 78, respectively.

Submount 74 can comprise a portion of FR4 material, a portion of a PCB, a portion of a MCPCB, or a portion of a circuit. First and second electrical contacts 76 and 78 can be integrally formed with secondary submount 74 and can be inset with respect to portions of secondary submount 74. LED chip 16 can be disposed over primary submount 72 but electrically connected with a portion of secondary submount 74. As shown in FIG. 6, wirebonds 18 extend from LED chip 16 and terminate at first and second electrical contacts 76 and 78, respectively. In one aspect, wirebonds 18 can terminate at first and second electrical contacts 76 and 78, respectively, where the termination location at the electrical contacts can be along a plane that can, but does have to be, on (co-planar) or substantially close to a plane or level of at least a bottom surface of LED chip 16. Although not shown, in some aspects, component 70 can be encapsulated, and is contemplated herein.

Figure 7A:
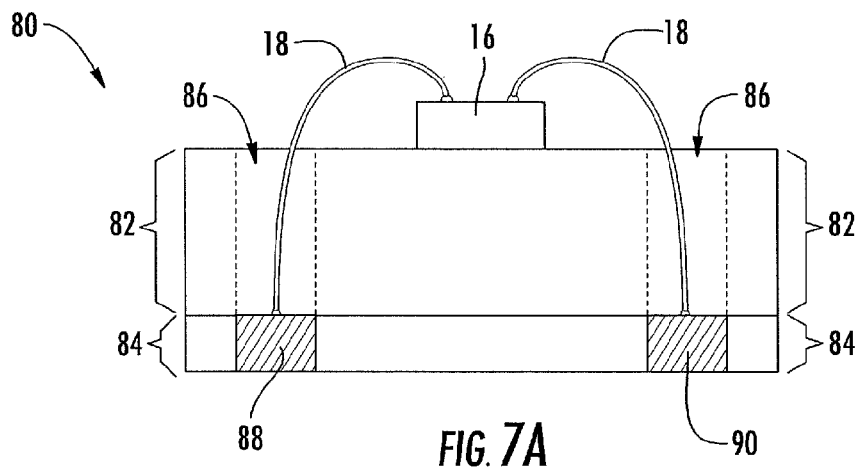
FIGS. 7A and 7B are cross-sectional and top plan views, respectively, illustrating a further embodiment of a light emitter component according to the disclosure herein.
Figure 7B:
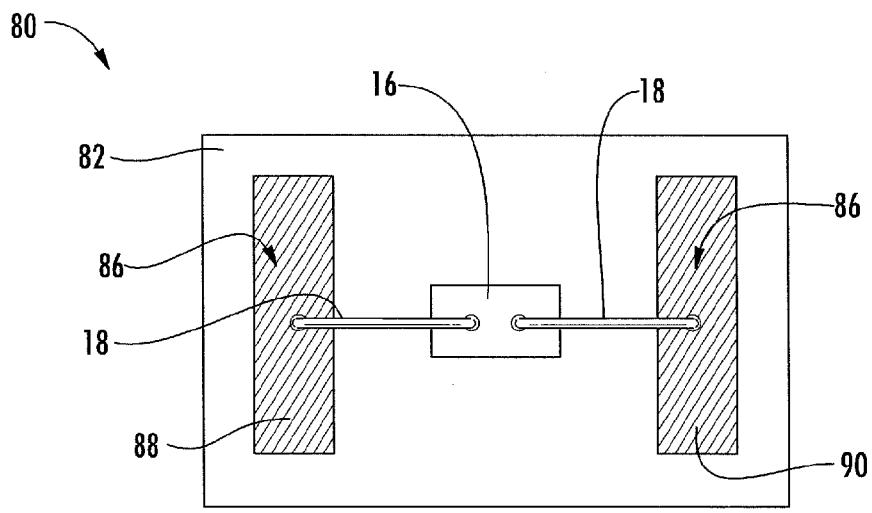

FIGS. 7A and 7B illustrate cross-sectional and top views, respectively, of a further embodiment of a light emitter component, generally designated 80. Component 80 can comprise a primary submount 82 and a secondary submount 84. Primary submount 82 can be ceramic based such as previously described submount 12 (FIG. 1). Secondary submount 84 can comprise any material as previously described herein and can comprise one or more electrically conductive portions. In this aspect, primary submount 82 can be the same length and/or width as secondary submount 84. To facilitate bonding of LED chip 16 to a secondary submount 84 having a same size as primary submount 82, primary submount 82 can comprise one or more thru-holes or vias 86. In one aspect, smaller footprint components can be achieved for example, as wirebonding can advantageously be performed through the primary submount 82. Primary and secondary submounts 82 and 84, respectively, can comprise any suitable thicknesses. In one aspect, primary submount 82 can be thicker than secondary submount. In other aspects, primary submount 82 can be thinner than secondary submount 84.

LED chip 16 can be directly mounted over a portion of primary submount 82, but electrically connected to a portion of secondary submount 84. Notably, primary submount 82 can comprise one or more thru-holes or vias 86 through which wirebonds 18 can extend to facilitate bonding with secondary submount 84. For example, secondary submount 84 can comprise a first electrical contact 88 and a second electrical contact 90. First and second electrical contacts 88 and 90 may or may not be, for example, integral portions of secondary submount 84. As FIGS. 7A and 7B illustrate, LED chip 16 can be wirebonded directly to first and second electrical contacts 88 and 90 by extension of the wirebonds 18 through vias 86. As shown in FIG. 7A, wirebonds 18 extend from LED chip 16 and terminate at first and second electrical contacts 88 and 90, respectively. In one aspect, wirebonds 18 can terminate at first and second electrical contacts 88 and 90, respectively, where the termination location at the electrical contacts can be along a plane that can, but does have to be, at or below a plane or level of at least a portion of or all of the bottom surface of primary submount 82 to which LED chip 16 is mounted. Submount based components can advantageously and inexpensively be formed to accommodate smaller footprints and/or thinner or thicker parts as desired.

Figure 8:
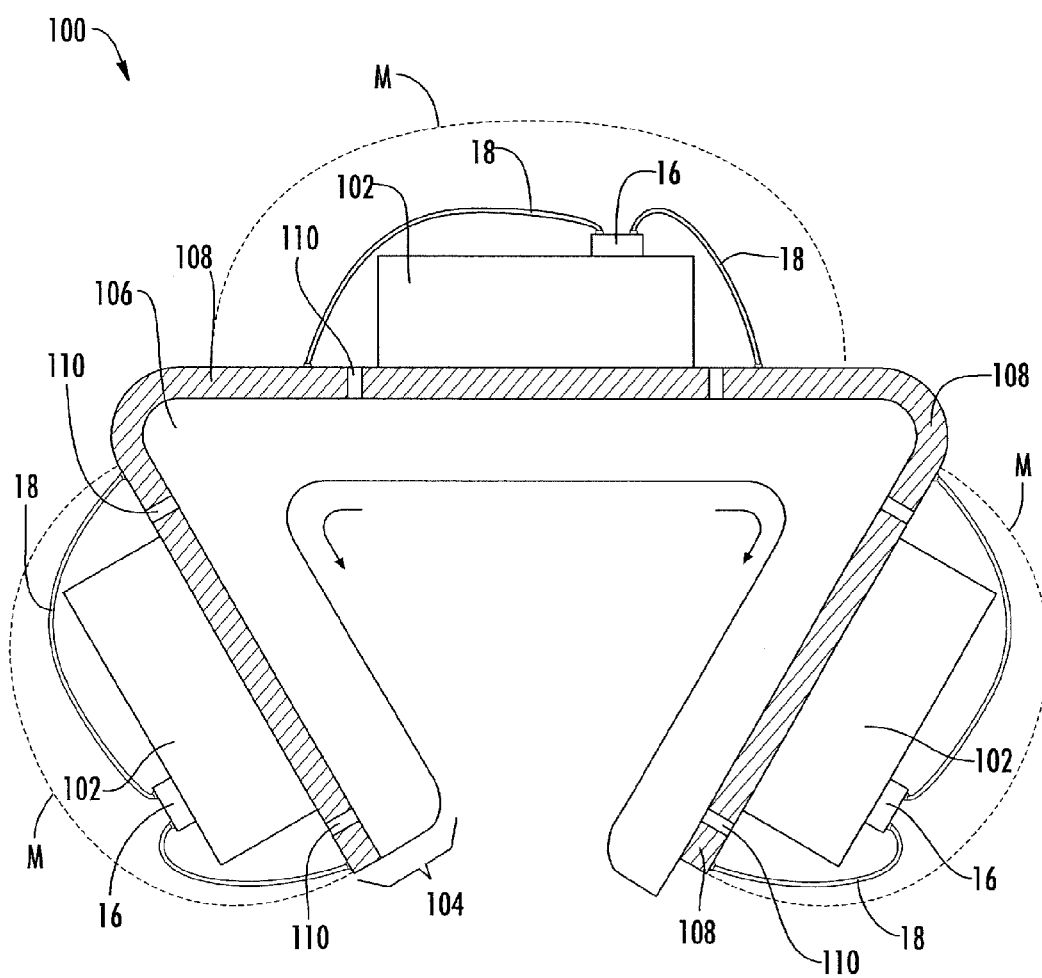
FIG. 8 is a cross-sectional view illustrating a further embodiment of a light emitter component according to the disclosure herein.

FIG. 8 illustrates a further embodiment of a light emitter component, generally designated 100. Component 100 can comprise at least one primary submount 102. In further aspects, more than one primary submount 102 having more than one LED chips 16 can be provided. In some aspects, an optical element and/or optical material M can be provided over portions of component 100. Optical material M is shown in phantom lines as it can be optional, and placement can be customized per lighting application. In some aspects, optical material can be confined over LED chips 16 only. In other aspects, optical material can be disposed over several portions and/or regions of component 100 and on multiple planes, surfaces, and/or dimensions.

Notably, component 100 can comprise a flexible secondary submount 104 over which more than one primary submounts 102 can be disposed. As the arrows indicate, submount 104 can comprise one or more portions adapted to bend or flex thereby emitting light in multiple directions or dimensions and/or from multiple surfaces. Secondary submount 104 can be adapted to advantageously bend to any desired configuration for emitting light in any desired pattern, shape, or configuration. In one aspect, secondary submount 104 can comprise a flexible circuit. In other aspects, secondary submount 104 can comprise a flexible core or base material 106.

Secondary submount 104 can comprise a core or base material 106 over which one or more electrically conducive portions 108 can be disposed. Base material 106 can comprise a layer of flexible thermally and/or electrically conductive material such as a metal, a metal alloy, Al, Cu, a plastic material, a dielectric material, and/or combinations thereof. Electrically conductive portions 108 can comprise areas of electrically conductive material such as areas of one or more metals or metal alloys. Electrically conductive portions 108 can collectively form electrical contacts, such as anode and cathode pairs configured to receive and deliver electrical current to the one or more LED chips 16. LED chips 16 can electrically connect to portions of secondary submount 104 via wirebonds 18. Secondary submount 104 can further comprise one or more intermediate portions 110. Intermediate portions can be adapted or configured for electrically and/or thermally separating one or more portions of the submount. In one aspect, intermediate portions 110 can comprise an electrically insulating material such as a dielectric or plastic material such as a photo-imagable solder mask, for separating electrically conductive portions 108 of secondary submount 104.

Component 100 can advantageously adapt to any suitable size, for example, by flexing or bending to provide customized multi-faceted components configured to emit light from more than one surface and in more than one direction. For example and without limitation, component 100 can emit light in at least three directions from at least three LED chips 16 disposed over at least three primary submounts 102. Any number of LED chips 16 combined with any number of primary submounts 102 is contemplated herein. For example, components having two primary submounts 102 are contemplated herein, for example three or more primary submounts 102, four or more primary submounts 102, five or more primary submounts 102, or more than six primary submounts 102. Each primary submount 102 can be angled with respect to an adjacent primary submount 102. One, more than one, a plurality, and/or an array of LED chips 16 can be disposed over each primary submount 102.

Figure 9A:
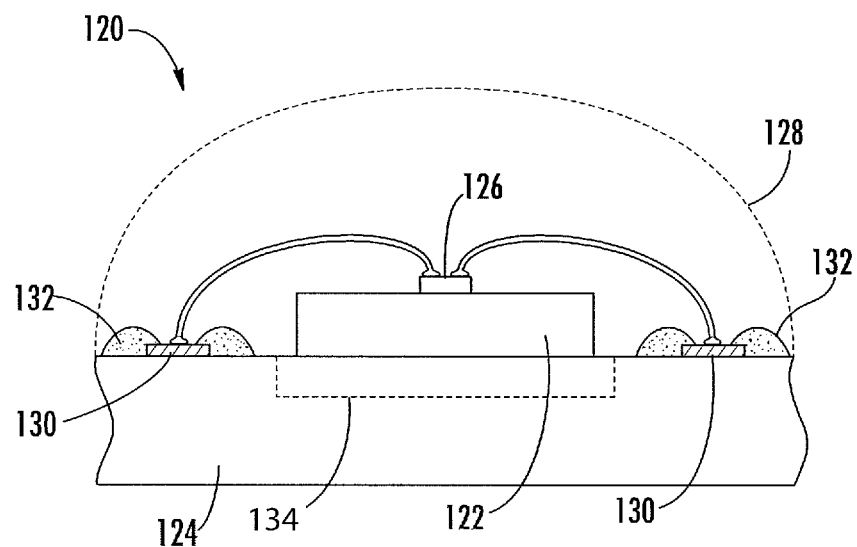
FIGS. 9A and 9B are sectional views illustrating a further embodiment of a light emitter component according to the disclosure herein.
Figure 9B:
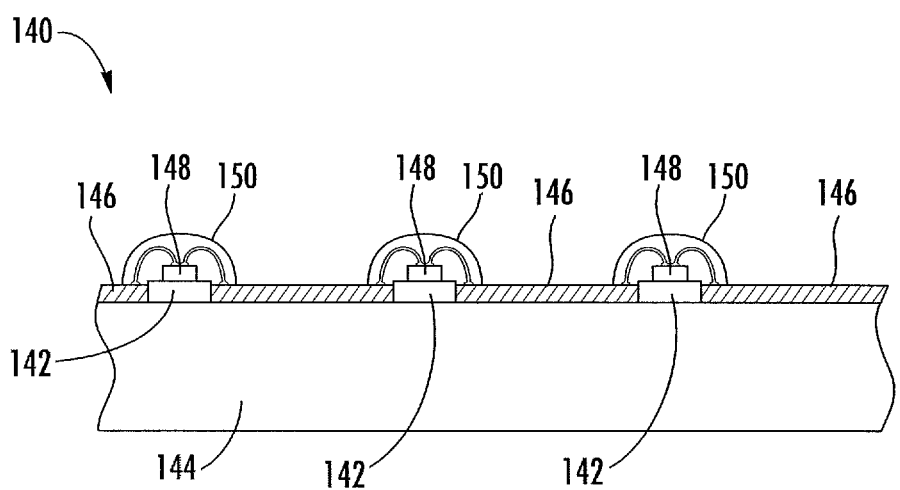

FIGS. 9A and 9B illustrate sectional views of further embodiments of light emitter components, specifically chip-on-board (COB) type light emitter components. FIG. 9A illustrates a component generally designated 120. Component 120 can comprise a primary submount 122 and a secondary submount 124. Primary submount 122 can comprise a highly reflective ceramic or ceramic based material such as previously described submount 12 (FIG. 1). Secondary submount 124 can comprise any material as previously described herein, such as PCB, FR4, metal, etc., and can comprise one or more electrically conductive portions, such as electrically conductive traces 130. Traces 130 can comprise any suitable metal or metal alloy such as Cu. In some aspects, secondary submount 124 can further comprise one or more layers of reflective material, such as a solder mask 132 disposed over portions thereof, and over portions of traces 130.

In some aspects, an LED chip 126 can be directly attached to primary submount 122 in a COB arrangement, and wirebonded to portions of secondary submount 124. In some aspects, secondary submount 124 can comprise a metallic heat sink or trace 134 disposed below portions of primary submount 122. Trace 134 is illustrated in phantom lines, as it can be optional. In some aspects, addition of trace 134 below primary submount can improve thermal management properties within component 120.

Component can further comprise an optical material or optical element, generally designated 128. Optical element 128 can comprise a lens or a layer of silicone encapsulant that can be disposed over portions of component 120. In some aspects, encapsulant can be directly dispensed over portions of LED chip 126 and/or portions of primary and secondary submounts 122 and 124, respectively, and can directly adhere to portions thereof. In some aspects, the encapsulant can be dispensed in liquid form, and can be held in position over portions of secondary submount 124 via surface tension until it is cured or otherwise hardened over device 120.

FIG. 9B illustrates another example of a COB light emitter component, generally designated 140. Component 140 can comprise an arrangement of multiple primary submounts 142 provided over a single secondary submount 144. LED chips 148 can be disposed over each primary submount 142 and wirebonded to conductive traces 146 of secondary submount 144. Notably, conductive traces 146 can extend between each primary submount 144. That is, LED chips 148 can be serially connected over portions of secondary submount 142 via connections to conductive traces 146. In some aspects, conductive traces 146 can comprise Cu traces.

In some aspects, an optical element 150 can be provided over each LED chip 148 and/or portions of primary submount 142 and portions of traces 146. In some aspects, optical element 150 can comprise a molded lens. In other aspects, silicone encapsulant can be dispensed directly over device 140 and held in position via surface tension until it is cured or hardened. In some aspects, primary submounts 142 can comprise a highly reflective ceramic or ceramic based material such as previously described submount 12 (FIG. 1). Secondary submount 144 can comprise any material as previously described herein, such as a dielectric material, a polymeric material, another ceramic material, FR4, or any other suitable material.

Embodiments of the present disclosure shown in the drawings and described above are exemplary of numerous embodiments that can be made within the scope of the appended claims. It is contemplated that the novel submount based light emitter components and methods of making the same can comprise numerous configurations other than those specifically disclosed.

What is claimed is:

1. A light emitter component comprising:
   a primary submount comprising a reflective ceramic material;
   a secondary submount; and
   at least one light emitter chip;
   wherein the at least one light emitter chip is disposed over a portion of the primary submount and electrically connected to a portion of the secondary submount.

2. The light emitter component of claim 1, wherein the ceramic material comprises alumina or aluminum oxide ($Al_2O_3$), zirconia or zirconium dioxide ($ZrO_2$), beryllium oxide (BeO), titanium dioxide (TiO2), yttrium-aluminum-garnet (YAG), aluminum nitride (AlN), and/or derivatives and/or combinations thereof.

3. The light emitter component of claim 1, wherein the secondary submount comprises a portion of a printed circuit board (PCB), a metal-core printed circuit board (MCPCB), an FR4 material, a ceramic material, a leadframe, a retaining member, a flexible circuit, and/or combinations thereof.

4. The light emitter component of claim 1, wherein the at least one light emitter chip is electrically connected to the secondary submount by at least one wirebond.

5. The light emitter component of claim 4, wherein a termination location for the wirebond at the secondary submount is along a first plane that is at least substantially close to or co-planar with a second plane of a bottom surface of the LED chip.

6. The light emitter component of claim 4, wherein the wirebond is encapsulated.

7. The light emitter component of claim 1, wherein the at least one light emitter chip comprises either a growth substrate or a carrier substrate.

8. The light emitter component of claim 1, wherein the primary submount is disposed over the secondary submount.

9. The light emitter component of claim 1, wherein the at least one chip is directly attached to the primary submount with an adhesive.

10. The light emitter component of claim 1, further comprising two or more light emitter chips.

11. The light emitter component of claim 10, further comprising six light emitter chips.

12. The light emitter component of claim 1, wherein the primary submount is mounted to the secondary submount via an epoxy, a silicone material, a solder, a eutectic material, AuSn solder, and/or combinations thereof.

13. The light emitter component of claim 1, wherein the primary submount is inset with respect to the secondary submount.

14. The light emitter component of claim 1, wherein the primary submount is disposed between a first portion of the secondary submount and a second portion of the secondary submount.

15. The light emitter component of claim 1, further comprising an optical element disposed over the at least one emitter chip.

16. The light emitter component of claim 1, further comprising an encapsulant at least partially disposed over the at least one emitter chip.

17. The light emitter component of claim 1, wherein the primary submount is retained within a portion of the secondary submount.

18. The light emitter component of claim 17, wherein the secondary submount is disposed along at least two surfaces of the primary submount.

19. The light emitter component of claim 1, wherein the primary submount is slidable with respect to the secondary submount before fixing the secondary submount therein with adhesive.

20. The light emitter component of claim 1, wherein the primary submount comprises a thru-hole.

21. The light emitter component of claim 20, wherein a wirebond extends through the thru-hole.

22. The light emitter component of claim 21, wherein a termination location for the wirebond at the secondary submount is along a first plane that is co-planar with or below a second plane of at least a portion of or all of a bottom surface of the primary submount.

23. The light emitter component of claim 1, wherein the secondary submount is flexible.

24. A light emitter component comprising:
at least one primary submount;
at least one secondary submount; and
at least one light emitter chip mounted to the primary submount and electrically connected to the at least one secondary submount;
wherein the at least one secondary submount is flexible for directing light from the at least one emitter chip in any desired direction.

25. The light emitter component of claim 24, comprising a first primary submount and a second primary submount, wherein each primary submount is disposed over the secondary submount, and wherein the first primary submount is angled with respect to the second primary submount.

26. The light emitter component of claim 24, wherein the at least one primary submount comprises a ceramic material.

27. The light emitter component of claim 26, wherein the ceramic material comprises alumina or aluminum oxide ($Al_2O_3$), zirconium dioxide ($ZrO_2$), beryllium oxide (BeO), titanium dioxide (TiO2), yttrium-aluminum-garnet (YAG), aluminum nitride (AlN), and/or derivatives and/or combinations thereof.

28. The light emitter component of claim 26, wherein the at least one secondary submount comprises a printed circuit board (PCB), a metal-core printed circuit board (MCPCB), an FR4 material, a ceramic material, a leadframe, a retaining member, a flexible circuit, and/or combinations thereof.

29. The light emitter component of claim 26, wherein the primary submount is mounted to the secondary submount via an epoxy, a silicone material, solder, a eutectic material, AuSn solder, and/or combinations thereof.

30. The light emitter component of claim 26, wherein the at least one light emitter chip is electrically connected to the at least one secondary submount by at least one wirebond.

31. A method of providing a light emitter component, the method comprising:
providing a reflective, ceramic based primary submount;
providing a secondary submount;
attaching at least one light emitter chip to the primary submount; and
electrically connecting the light emitter chip to the secondary submount.

32. The method of claim 31, further comprising attaching the primary submount to the secondary submount.

33. The method of claim 31, further comprising providing an optical element over a portion of the at least one light emitter chip.

34. The method of claim 31, wherein the ceramic based primary submount comprises alumina or aluminum oxide ($Al_2O_3$), zirconium dioxide ($ZrO_2$), beryllium oxide (BeO), titanium dioxide (TiO2), yttrium-aluminum-garnet (YAG), aluminum nitride (AlN), and/or derivatives and/or combinations thereof.

35. The method of claim 31, wherein providing the secondary submount comprises providing a printed circuit board (PCB), a metal-core printed circuit board (MCPCB), an FR4 material, a ceramic material, a leadframe, a retaining member, a flex circuit, and/or combinations thereof.

36. The method of claim 31, further comprising sliding the primary submount into a portion of the secondary submount.

37. The method of claim 36, further comprising fixing the primary submount into the portion of the secondary submount via and adhesive.

38. The method of claim 31, further comprising insetting the primary submount within a portion of the secondary submount.

39. The method of claim 31, comprising electrically connecting the light emitter chip to the secondary submount by a wirebond.

40. The method of claim 39, comprising electrically connecting the light emitter chip to the secondary submount by a wirebond wherein a termination location for the wirebond at the secondary submount is along a first plane that is at least substantially close to or co-planar with a second plane of a bottom surface of the LED chip.

41. The method of claim 31, wherein electrically connecting the at least one light emitter chip comprises a wirebond extending through a thru-hole disposed in the primary submount.

42. The method of claim 41, wherein the wirebond electrically connects to the secondary submount at a termination location that is along a first plane that is co-planar with or below a second plane of at least a portion of or all of a bottom surface of the primary submount.

43. The method of claim 31, further comprising providing at least two light emitter chips and bending the secondary submount for directing light from the at least two light emitter chips in any desired direction.

44. The method of claim 31, further comprising providing an encapsulant over the submount, wherein the encapsulant comprises one or more phosphors.

45. A light emitter component comprising:
a ceramic submount disposed on a ceramic mount; and
at least one light emitter chip disposed over the ceramic submount.

46. The light emitter component of claim 45, wherein the ceramic submount is attached to the ceramic mount via at least one material consisting of a glue, an epoxy, a silicone, or a solder.

47. The light emitter component of claim 45, wherein the ceramic submount comprises alumina or aluminum oxide ($Al_2O_3$), zirconia or zirconium dioxide ($ZrO_2$), beryllium oxide (BeO), titanium dioxide (TiO2), yttrium-aluminum-garnet (YAG), aluminum nitride (AlN), and/or derivatives and/or combinations thereof.

48. The light emitter component of claim 47, wherein the ceramic mount comprises alumina or aluminum oxide ($Al_2O_3$), zirconia or zirconium dioxide ($ZrO_2$), beryllium oxide (BeO), titanium dioxide (TiO2), yttrium-aluminum-garnet (YAG), aluminum nitride (AlN), and/or derivatives and/or combinations thereof.

49. The light emitter component of claim 45, wherein the at least one light emitter chip is electrically connected to a portion of the ceramic mount by at least one wirebond.

50. The light emitter component of claim 45, further comprising an optical element disposed over the at least one emitter chip.

51. The light emitter component of claim 45, further comprising an encapsulant at least partially disposed over the at least one emitter chip.

52. The light emitter component of claim 45, wherein the primary submount is retained within a portion of the secondary submount.

* * * * *